United States Patent
Wei et al.

(10) Patent No.: US 8,372,714 B2
(45) Date of Patent: Feb. 12, 2013

(54) SEMICONDUCTOR DEVICE AND METHOD OF MANUFACTURING A SEMICONDUCTOR DEVICE

(75) Inventors: Kuo Liang Wei, Hsinchu County (TW); Hong-Ji Lee, Taoyuan County (TW)

(73) Assignee: Macronix International Co., Ltd. (TW)

( * ) Notice: Subject to any disclaimer, the term of this patent is extended or adjusted under 35 U.S.C. 154(b) by 207 days.

(21) Appl. No.: 12/824,757

(22) Filed: Jun. 28, 2010

(65) Prior Publication Data
US 2011/0316096 A1      Dec. 29, 2011

(51) Int. Cl.
*H01L 21/336* (2006.01)
(52) U.S. Cl. .......... 438/270; 257/334; 257/E29.13
(58) Field of Classification Search .......... 438/270; 257/330, 331, 332, 333, 334, E29.13
See application file for complete search history.

(56) References Cited

U.S. PATENT DOCUMENTS

| | | | |
|---|---|---|---|
| 5,403,435 A | 4/1995 | Cathey et al. | |
| 5,945,708 A * | 8/1999 | Tihanyi | 257/331 |
| 6,417,084 B1 | 7/2002 | Singh et al. | |
| 6,774,029 B2 | 8/2004 | Shin et al. | |
| 6,777,764 B2 | 8/2004 | Hsieh et al. | |
| 6,927,448 B2 | 8/2005 | Liu | |
| 7,354,829 B2 | 4/2008 | Aoki et al. | |
| 7,544,616 B2 | 6/2009 | Lu et al. | |
| 7,811,891 B2 * | 10/2010 | Orlowski et al. | 438/285 |
| 2002/0137296 A1 | 9/2002 | Satoh et al. | |
| 2004/0007734 A1 | 1/2004 | Kato et al. | |
| 2004/0018739 A1 | 1/2004 | Abooameri et al. | |
| 2005/0167745 A1 * | 8/2005 | Ishida et al. | 257/329 |
| 2007/0196988 A1 * | 8/2007 | Shroff et al. | 438/299 |
| 2008/0079070 A1 * | 4/2008 | Seo et al. | 257/333 |
| 2009/0267132 A1 | 10/2009 | Cha et al. | |

* cited by examiner

*Primary Examiner* — Jarrett Stark
*Assistant Examiner* — John M Parker
(74) *Attorney, Agent, or Firm* — Baker & Mckenzie LLP

(57) ABSTRACT

A semiconductor device can be manufactured by a method that includes forming a structure that includes a plurality of layers of semiconductor material. One or more etching processes are performed on the multi-layered semiconductor structure, and then an $Ar/O_2$ treatment is performed on the multi-layered semiconductor structure. The $Ar/O_2$ treatment includes exposure of the structure to Ar ion bombardment and $O_2$ molecular oxidation. The $Ar/O_2$ treatment can be used to create a bottle-shaped structure.

12 Claims, 2 Drawing Sheets

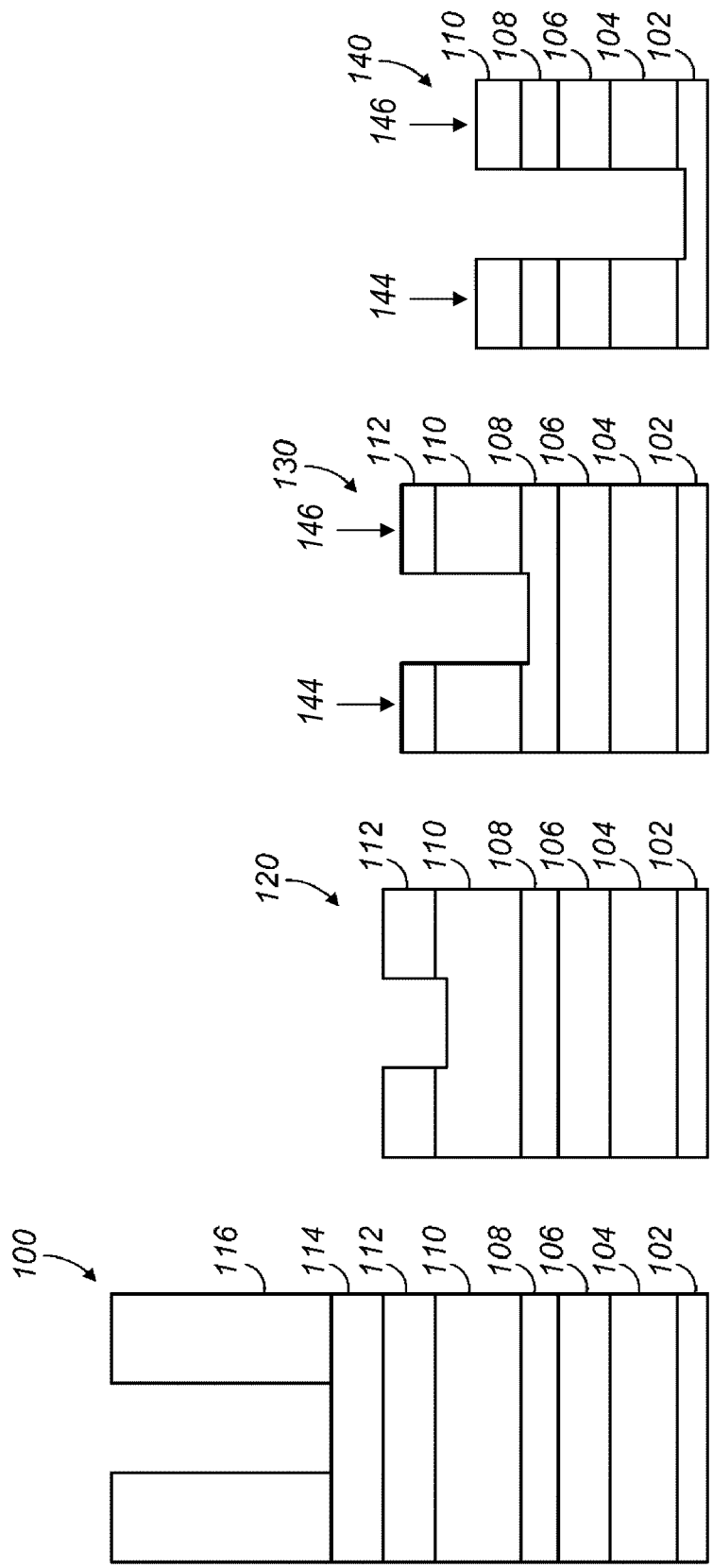

SEMICONDUCTOR DEVICE AND METHOD OF MANUFACTURING A SEMICONDUCTOR DEVICE

BACKGROUND

1. Technical Field

The present application relates to processes for forming integrated circuit devices and, more particularly, to processes for forming integrated circuit devices having a gate structure.

2. Related Art

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are have been implemented. This may include the width and spacing of interconnecting lines and the surface geometry such as corners and edges of various features.

The creation of small features with close spacing between adjacent features can be accomplished through the use of high-resolution photolithographic processes. In general, lithography refers to processes for transferring patterns between various media. It includes techniques used for the fabrication of integrated circuits in which a silicon wafer is coated with a radiation-sensitive film (referred to as a resist layer) and then exposing selected areas of the coated surface to a light source (for example optical light, x-rays, or an electron beam) that illuminates the coated surface through an intervening master template (referred to as a mask) for a desired pattern. The lithographic coating is generally a radiation-sensitive coating that is suitable for receiving a projected image of the subject pattern. Once the image is projected, it is indelibly formed in the coating. Exposure of the coating through a photomask causes the image area to become either more or less soluble (depending on the coating) in a particular solvent developer. The more soluble areas are removed in the developing process to leave the pattern image in the coating as less soluble polymer.

The projected image may be either a negative or a positive of the subject pattern. Two basic types of photoresist have been developed over the years: positive photoresist and negative photoresist. With positive photoresist, the portion thereof that is exposed to light is removed during developing, while with negative photoresist, the portion thereof that is not exposed to light is removed. Historically, negative resists have been unsuitable for applications requiring line and space dimensions of the resist pattern which are less than 3 μm. Thus, positive resists have supplanted negative resists for very large scale integration (VLSI) devices.

One particular problem related to the use of positive resist can be fatal to integrated circuits. Raised features often acquire unwanted re-entrant profiles during processing. Several known mechanisms will produce re-entrant profiles on multi-layer features. One common mechanism often manifests itself during an etch of sequentially deposited layers. If one or more underlying layers etch at a faster rate than the top-most layer, a recessed or re-entrant profile will result. Another common mechanism involves chemical vapor deposition (CVD). For certain CVD reactions, as material deposits on a rectangular, raised feature, the deposition rate tends to be greater at the corners, resulting in a feature having a re-entrant profile. Another mechanism that results in re-entrant profiles on multi-layer features is related to oxidation effects. For example, if the sidewall of a multi-layer stack containing a tungsten silicide layer in all but the base layer is oxidized, the edges of the tungsten silicide layer will oxidize much more rapidly than the other layers, resulting in a re-entrant sidewall profile. There are also several mechanisms, such as mask proximity effects, and etch effects, that are known to cause re-entrant profiles on single layer features. The differential etch rate that results from a doping gradient in a single layer is a well-known example of the latter phenomenon. Generally speaking, the greater the dopant level, the faster the etch rate.

If a raised feature has a re-entrant profile, any positive resist that is beneath the overhang created by the re-entrant profile cannot be exposed during the printing (exposure) process. Thus, the resist beneath the overhang will remain in place after developing. This is particularly problematic when a conductive layer that has been deposited over dielectrically-coated, re-entrant profile features must be selectively etched to form multiple portions of the conductive layer that must be detached and electrically decoupled from one another. The re-entrant profile may provide a path which shorts together several of the multiple portions of the conductive layer that should be electrically isolated from one another. Such problems make it difficult to maintain a desirable critical dimension, particularly for 65 nm and smaller technology design nodes.

Thus, it is desirable to find alternative approaches for the manufacturing of integrated circuits in order to allow for desired critical dimensions without significant increases in manufacturing process complexity and costs.

SUMMARY

Semiconductor devices and methods associated with the manufacturing of semiconductor devices are described herein. According to one aspect of the present disclosure, a method of manufacturing a semiconductor device can include forming a gate structure having a plurality of layers, etching the gate structure, and performing an $Ar/O_2$ treatment prior to a final overetching of the gate structure to create a bottle-shaped gate structure.

In some embodiments, the gate structure can be a polysilicon gate. In such embodiments, the $Ar/O_2$ treatment can include flowing $O_2$ gas in a range of 0 to 200 standard cubic centimeters per minute (SCCM), and flowing Ar in a range of 0 to 1000 standard cubic centimeters per minute (SCCM).

In some embodiments, the $Ar/O_2$ treatment can include applying source power in a range of 10 to 1000 Watts and bias power in a range of 10 to 300 Watts.

In some embodiments, the gate structure can comprise tungsten silicide, a first polysilicon layer, and a second polysilicon layer. In such embodiments, the $Ar/O_2$ treatment can be performed prior to overetching of the second polysilicon layer. Alternatively, the $Ar/O_2$ treatment can be performed prior to overetching of the first polysilicon layer. As another alternative, the $Ar/O_2$ treatment can be performed prior to overetching of the tungsten silicide.

In some embodiments, the gate structure can be a metal gate. In such embodiments, the $Ar/O_2$ treatment can include flowing $O_2$ gas in a range of 0 to 200 standard cubic centimeters per minute (SCCM), and flowing Ar in a range of 0 to 1000 standard cubic centimeters per minute (SCCM). Also, in such embodiments, the $Ar/O_2$ treatment can include applying source power in a range of 10 to 1000 Watts and bias power in a range of 10 to 300 Watts.

The $Ar/O_2$ treatment can be performed ex-situ in an oxide etching chamber. The $Ar/O_2$ treatment can comprise flowing $O_2$ gas in a range of 0 to 200 standard cubic centimeters per minute (SCCM), flowing Ar in a range of 0 to 1000 standard cubic centimeters per minute (SCCM), and applying source power in a range of 10 to 1000 Watts and bias power in a range of 10 to 300 Watts.

According to another aspect of the present disclosure, a gate structure of a semiconductor device can include a dielectric layer on a semiconductor substrate, a first polysilicon layer on the dielectric layer, and a second polysilicon layer on the polysilicon layer. The first polysilicon layer and second polysilicon layer form a bottle-shaped gate structure.

In some embodiments, the bottle-shaped gate structure can be formed by performing an $Ar/O_2$ treatment prior to final overetching of the gate structure. In some such embodiments, the gate structure can be a polysilicon gate. In such embodiments, the $Ar/O_2$ treatment can include flowing $O_2$ gas in a range of 0 to 200 standard cubic centimeters per minute (SCCM), and flowing Ar in a range of 0 to 1000 standard cubic centimeters per minute (SCCM). Also, in such embodiments the $Ar/O_2$ treatment can include applying source power in a range of 10 to 1000 Watts and bias power in a range of 10 to 300 Watts.

In some embodiments, the gate structure can comprise tungsten silicide, a first polysilicon layer, and a second polysilicon layer. In some such embodiments, the $Ar/O_2$ treatment can be performed prior to overetching of the second polysilicon layer. Alternatively, the $Ar/O_2$ treatment can be performed prior to overetching of the first polysilicon layer. As another alternative, the $Ar/O_2$ treatment can be performed prior to overetching of the tungsten silicide.

In some embodiments, the gate structure can be a metal gate. In some such embodiments, the $Ar/O_2$ treatment can include flowing $O_2$ gas in a range of 0 to 200 standard cubic centimeters per minute (SCCM), and flowing Ar in a range of 0 to 1000 standard cubic centimeters per minute (SCCM). Also, the $Ar/O_2$ treatment can include applying source power in a range of 10 to 1000 Watts and bias power in a range of 10 to 300 Watts.

According to still further aspects of the present disclosure, a semiconductor device can include a first polysilicon structure and a second polysilicon structure where at least one of the first and second polysilicon structures includes a bottle-shaped profile. The bottle-shaped profile includes, from a wafer side, a first width, a second width above the first width, the second width being greater than the first width, and a third width above the second width, the third width being less than the second width.

In some embodiments, the second width can be at an interface of the first polysilicon structure and the second polysilicon structure.

In some embodiments, the second width can be at the first polysilicon structure.

In some embodiments, the second width can be at the second polysilicon structure.

In some embodiments, the first and second polysilicon structures can be manufactured using a process that includes an $Ar/O_2$ treatment, wherein the $Ar/O_2$ treatment can include exposure to Ar ion bombardment and a gas comprising $O_2$.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 1A-1D show schematic cross-sectional views associated with a method of manufacturing a semiconductor device according to an embodiment of the present disclosure.

DETAILED DESCRIPTION

Figure 2B:
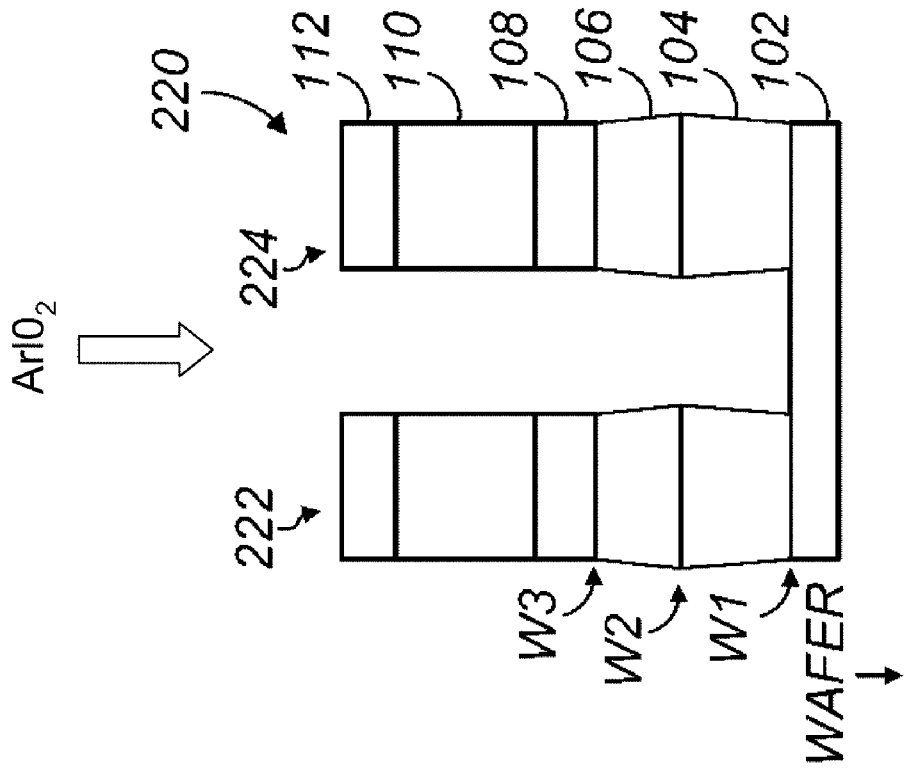
FIGS. 2A-2B show schematic cross-sectional views associated with a method of manufacturing a semiconductor device according to another embodiment of the present disclosure.

According to the present disclosure, a semiconductor device that comprises a word line (WL) or the like can be manufactured according to a process that offers improvements in manufacturing reliability. More specifically, the semiconductor manufacturing methods that are described herein provide for a reduction in the bridge fail rate when compared to prior methods of manufacturing semiconductor devices. According to some embodiments, the manufacturing methods described herein include an ex-situ $O_2/Ar$ treatment after an etching procedure, for example after a polysilicon-gate etching process. The post-etching ex-situ 02/Ar treatment can effectively reduce the height of a barrier diffusion oxide structure, round the corner of a barrier diffusion oxide structure, and thereby expose a polysilicon stringer behind the barrier diffusion oxide structure. The post-etching ex-situ 02/Ar treatment can thus help to remove the polysilicon stringer by ion bombardment and provide benefits for a subsequent oxidation process.

FIG. 1A shows a film stack structure 100 used to fabricate a transistor on a wafer or substrate according to a conventional method. The film stack structure 100 can be formed over a substrate (not shown) such as a silicon (Si) substrate, a germanium (Ge) substrate, or a silicon-germanium (Si—Ge) substrate. Alternatively, the substrate can include a silicon-on-insulator (SOI) substrate or a germanium-on-insulator (GOI) substrate.

The film stack structure 100 can include an oxide-nitride-oxide (ONO) layer 102, a first polysilicon layer 104, a second polysilicon layer 106, a tungsten silicide ($WSi_x$) layer 108, a hard mask (HM2) layer 110 formed of tetra ethyl ortho silicate (TEOS), a hard mask layer (HM1) 112 formed of polysilicon, a bottom antireflective coating (BARC) layer 114, and a patterned photoresist layer 116. In one embodiment, the first polysilicon layer 104 is a bitline and the second polysilicon layer 106 is a wordline.

The film stack structure 100 can be formed by various processes, for example including known deposition processes, as part of a process for manufacturing an integrated circuit device. For example, the structure 100 can be formed as part of a process for manufacturing a memory device, such as a DRAM or Flash memory device. In some embodiments, additional layers may be included below the ONO layer 102 and the wafer substrate, depending on the device that is being manufactured.

The patterned photoresist layer 116 has been patterned so as to form a pair of word line structures. FIGS. 1A-1D show results of intermediate process steps for forming the word line structures. It will be appreciated that the word line structures shown in FIGS. 1A-1D can be manufactured to include polysilicon and/or tungsten silicide ($WSi_x$) and/or tungsten metal gates for respective transistor structures.

FIG. 1B shows a structure 120 that results from applying an etching process to the structure 100 for removing portions of the polysilicon hard mask layer 112. The etching process can include one or more wet or dry etching processes, including a polysilicon hard mask etching process. The etching process can include processes for removing the polysilicon hard mask layer 112, the BARC layer 114, and a portion of the TEOS HM layer 110 in regions of the structure 100 where the layers 110, 112, and 114 are not covered by the photoresist layer 116. Elsewhere, in regions of the structure 100 where the layers 110, 112, and 114 are covered by the photoresist layer 116, the etching process removes the photoresist layer 116 and the BARC layer 114.

FIG. 1C shows a structure 130 that results from applying an etching process to the structure 120 for removing portions of the TEOS hard mask layer 110. The etching process can include one or more wet etching processes, including a TEOS hard mask etching process. The etching process can include processes for removing the TEOS hard mask layer 110 and a portion of the $WSi_x$ layer 108 in regions of the structure 120 where the layers 108 and 110 are not covered by the polysilicon hard mask layer 112. Elsewhere, in regions of the structure 120 where the layers 108 and 110 are covered by the polysilicon hard mask layer 112, the etching process consumes a portion of the polysilicon hard mask layer 112.

FIG. 1D shows a structure 140 that results from applying an etching process to the structure 130 for removing portions of the polysilicon layers 104 and 106. The etching process can include one or more wet etching processes, including a polysilicon etching process. The etching process can include processes for removing the $WSi_x$ layer 108 and polysilicon layers 104 and 106 in regions of the structure 130 where the layers 104, 106, and 108 are not covered by the polysilicon hard mask layer 112. Elsewhere, in regions of the structure 130 where the layers 104, 106, and 108 are covered by the polysilicon hard mask layer 112, the etching process consumes the remaining polysilicon hard mask layer 112 and a portion of the TEOS hard mask layer 110.

The etching process used to make the structure 140 from the structure 130 also results in the formation of one or more oxide structures (not shown in the figure). For example, a barrier diffusion oxide layer can be formed between the word line structures 144 and 146. In some instances, the oxide structure can have an undesirable bridging effect between the word line structures 144 and 146. As critical dimensions of semiconductor devices become increasingly minute, such as for the 65 nm and 45 nm technology nodes, the bridging problem becomes more pronounced and significant.

Figure 2A:
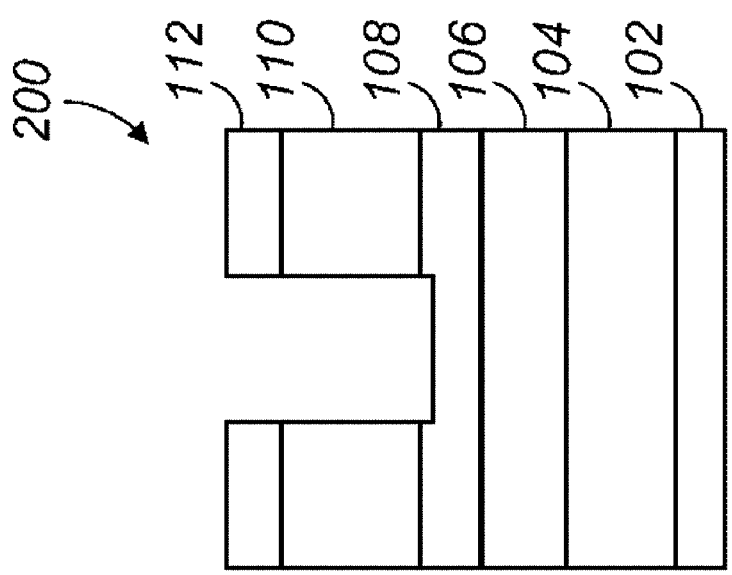

Referring next to FIGS. 2A-2B, a process can be employed for forming a bottle-shaped polysilicon gate structure according to some embodiments of the present disclosure. FIG. 2A shows a structure 200, which can be identical to, or substantially the same as, the structure 130 shown in FIG. 1C. Thus, the description of the structure 130, including the description of steps involved in manufacturing the structure 130, applies equally to the structure 200.

The structure 220 shown in FIG. 2B can be manufactured from the structure 200 by a process that includes an in-situ $Ar/O_2$ treatment. The in-situ $Ar/O_2$ treatment can be performed at different points in the process, for example as will be appreciated from the different process embodiments described below, and performed prior to the final overetching step of the gate structure to create a bottle-shaped gate structure. The in-situ $Ar/O_2$ treatment can result in an intermediate structure having an oxide polymer layer (not shown in the figure). Compared with the conventional method, the gate structure of the present disclosure provides a barrier diffusion oxide layer with thinner thickness.

In one embodiment, the structure 220 can be manufactured from the structure 200 by a process that includes a $WSi_x$ main etch (ME), followed by a $WSi_x$ over etch (OE), followed by the in-situ $Ar/O_2$ treatment, followed by removing oxide on the surface of the polysilicon gate, followed by a polysilicon ME, followed by a first polysilicon OE1, and finally followed by a second polysilicon OE2.

The $Ar/O_2$ treatment can be performed as a single step that includes Ar ion bombardment of the structure 140 and exposure of the structure 140 to $O_2$. During the Ar/O2 treatment, the O2 provides for promotion of oxidation removal of organic polymer materials.

In embodiments where the gate is made of polysilicon, the in-situ $Ar/O_2$ treatment can be performed prior to the final overetching step of the gate structure, and preferably prior to the second polysilicon overetch (OE2), the flow rate of Ar can preferably be in a range of 0 to 1000 standard cubic centimeters per minute (SCCM), and the flow rate of $O_2$ can be in a range of 0 to 200 SCCM. Also, the process source power can be in a range of 10 to 1000 Watts at 27 MHz, and the process bias power can be in a range of 10 to 300 Watts at 2 MHz. In the alternative embodiments, the in-situ $Ar/O_2$ treatment can be performed prior to the first polysilicon overetch (OE1) or tungsten silicide ($WSi_x$) overetch (OE).

In embodiments where the gate is made of metal such as tungsten, the in-situ $Ar/O_2$ treatment can be performed by using the flow rate of Ar can preferably be in a range of 0 to 1000 standard cubic centimeters per minute (SCCM), and the flow rate of $O_2$ can be in a range of 0 to 200 SCCM. Also, the process source power can be in a range of 10 to 1000 Watts at 27 MHz, and the process bias power can be in a range of 10 to 300 Watts at 2 MHz.

In an alternative embodiment, the structure 220 can be manufactured from the structure 200 by a process that includes a $WSi_x$ ME, followed by a $WSi_x$ OE, followed by a polysilicon ME, followed by a first polysilicon OE1, followed by breakthrough (BT) to perform an ex-situ $Ar/O_2$ treatment, and finally followed by a second polysilicon OE2. In such embodiments, the $Ar/O_2$ treatment can be performed in the oxide etching tool, the flow rate of Ar can preferably be in a range of 0 to 1000 standard cubic centimeters per minute (SCCM), and the flow rate of $O_2$ can be in a range of 0 to 200 SCCM. Also, the process source power can be in a range of 10 to 2000 Watts at 27 MHz, and the process bias power can be in a range of 10 to 2000 Watts at 2 MHz.

The $Ar/O_2$ treatment can be performed in either in-situ or ex-situ manners as described above for effectively reducing the word-line bridge failure rate without adversely impacting the poly gate critical dimension and profile. The Ar/O2 treatment can also reduce the height of the barrier diffusion oxide layer.

The resulting structure 220 includes a pair of bottle-shaped word line structures 222 and 224. Each of the word line structures 222 and 224 has an at least somewhat bottle-shaped profile that includes first, second, and third widths W1, W2, and W3. The first and third widths W1 and W3 can be different widths or can be substantially the same width. However, the second width W2 is greater than the first width W1, and the second width W2 is greater than the third width W3. Thus, the word line structures 222 and 224 both include, from a wafer side (indicated in FIG. 2B where the wafer is below the ONO layer 102), a first width, a second width above the first width, the second width being greater than the first width, and a third width above the second width, the third width being less than the second width. More specifically, the word line structures 222 and 224 can each include first and second polysilicon layers 104 and 106, where the first polysilicon layer 104 widens from the wafer side and the second polysilicon layer 106 narrows from the wafer side. For example, in the illustrated embodiment, the first polysilicon layer 104 widens from the first width W1 to the second width W2, and the second polysilicon layer 106 narrows from the second width W2 to the third width W3. The position of width W2 may not necessarily be located at the interface of the first and second polysilicon layers 104 and 106. Instead, the width W2 can be located more upward or downward than shown in FIG. 2B, for example in the first polysilicon layer 104 or in the second polysilicon layer 106.

The bottle-shaped word line structures 222 and 224 effectively enlarge the poly-gate etch critical dimension (ECD) without producing more by-products and without introducing an unstable manufacturing process or tool. Since the manufacture of the bottle-shaped word line structures 222 and 224 involve the use of the Ar/O$_2$ treatment, the height of a barrier diffusion oxide can also be reduced and stringers exposed as described above, thereby reducing the risk of word line bridge failure. This improved manufacturing process represents an improvement over prior processes, particularly those that involved an attempt to gain critical dimension. For example, some such prior processes involve the introduction of a polymer source in the etching process; however, such processes produce more complex by-products and introduce an undesirable negative influence on the stability of manufacturing processes and tools. Other prior processes involve the deposition of a liner on the hard-mask side wall; however, such processes also increase the cost and complexity of the manufacturing process. The manufacturing process described herein is effective at enlarging the poly-gate etch ECD without introducing more complex by-products, and without introducing such significant cost increases.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method of manufacturing a semiconductor device, comprising:
    forming a gate structure having a plurality of layers, the plurality of layers comprising a polysilicon layer;
    etching the polysilicon layer of the gate structure; and
    performing an Ar/O$_2$ treatment prior to an overetching of the etched gate structure to form a bottle-shaped gate structure.

2. The method of claim 1, wherein the gate structure is a polysilicon gate.

3. The method of claim 2, wherein the Ar/O$_2$ treatment includes flowing O$_2$ gas in a range of 0 to 200 standard cubic centimeters per minute (SCCM), and flowing Ar in a range of 0 to 1000 standard cubic centimeters per minute (SCCM).

4. The method of claim 1, wherein the Ar/O$_2$ treatment includes applying source power in a range of 10 to 1000 Watts and bias power in a range of 10 to 300 Watts.

5. The method of claim 1, wherein the gate structure comprises tungsten silicide, a first polysilicon layer, and a second polysilicon layer.

6. The method of claim 5, wherein the Ar/O$_2$ treatment is performed prior to overetching of the second polysilicon layer.

7. The method of claim 5, wherein the Ar/O$_2$ treatment is performed prior to overetching of the first polysilicon layer.

8. The method of claim 5, wherein the Ar/O$_2$ treatment is performed prior to overetching of the tungsten silicide.

9. The method of claim 1, wherein the gate structure is a metal gate.

10. The method of claim 9, wherein the Ar/O$_2$ treatment includes flowing O$_2$ gas in a range of 0 to 200 standard cubic centimeters per minute (SCCM), and flowing Ar in a range of 0 to 1000 standard cubic centimeters per minute (SCCM).

11. The method of claim 9, wherein the Ar/O$_2$ treatment includes applying source power in a range of 10 to 1000 Watts and bias power in a range of 10 to 300 Watts.

12. The method of claim 1, wherein the Ar/O$_2$ treatment is performed ex-situ in an oxide etching chamber, and comprises flowing O$_2$ gas in a range of 0 to 200 standard cubic centimeters per minute (SCCM), flowing Ar in a range of 0 to 1000 standard cubic centimeters per minute (SCCM), applying source power in a range of 10 to 1000 Watts and bias power in a range of 10 to 300 Watts.

* * * * *